United States Patent
Chen

(10) Patent No.: US 9,093,858 B2
(45) Date of Patent: Jul. 28, 2015

(54) ILLUMINATION SYSTEM AND ILLUMINATION DRIVING METHOD

(71) Applicant: Lextar Electronics Corporation, Hsinchu (TW)

(72) Inventor: Po-Shen Chen, Hsinchu (TW)

(73) Assignee: LEXTAR ELECTRONICS CORPORATION, Hsinchu (TW)

( * ) Notice: Subject to any disclaimer, the term of this patent is extended or adjusted under 35 U.S.C. 154(b) by 128 days.

(21) Appl. No.: 14/058,529

(22) Filed: Oct. 21, 2013

(65) Prior Publication Data

US 2014/0167610 A1 Jun. 19, 2014

(30) Foreign Application Priority Data

Dec. 13, 2012 (TW) .............................. 101147189 A

(51) Int. Cl.
*H05B 37/02* (2006.01)
*H02J 9/06* (2006.01)

(52) U.S. Cl.
CPC ........................................ *H02J 9/06* (2013.01)

(58) Field of Classification Search
USPC ................. 315/86, 291, 307, 362; 307/64, 66
See application file for complete search history.

(56) References Cited

U.S. PATENT DOCUMENTS

| | | | | |
|---|---|---|---|---|
| 4,890,004 A | * | 12/1989 | Beckerman | 307/66 |
| 5,471,114 A | * | 11/1995 | Edwards et al. | 315/86 |
| 5,646,486 A | * | 7/1997 | Edwards et al. | 315/86 |

FOREIGN PATENT DOCUMENTS

TW M279800 11/2005

\* cited by examiner

*Primary Examiner* — Jason M Crawford
(74) *Attorney, Agent, or Firm* — Moser Taboada

(57) ABSTRACT

An illumination system includes a light-emitting device, a first switch element, a driving device, a detecting circuit, an arithmetic unit and a power supply unit. The first switch element is configured for receiving an external voltage supplied by an external power source. The driving device is configured for converting the external voltage to a direct-current power signal for driving the light-emitting device to emit light; the detecting circuit is configured for detecting a voltage across the first switch element and converting the voltage to a detecting signal; the arithmetic unit is configured for performing an arithmetic operation on the direct-current power signal and the detecting signal to generate a control signal; and the power supply unit is configured for supplying power for the light-emitting device according to the control signal and driving the light-emitting device to emit light. An illumination driving method is also disclosed herein.

20 Claims, 7 Drawing Sheets

ILLUMINATION SYSTEM AND ILLUMINATION DRIVING METHOD

RELATED APPLICATIONS

This application claims priority to Taiwan Application Serial Number 101147189, filed Dec. 13, 2012, which is herein incorporated by reference.

BACKGROUND

1. Technical Field

The present disclosure relates to an illumination system. More particularly, the present disclosure relates to an emergency illumination system which is able to automatically judge power interrupted situation.

2. Description of Related Art

Traditional emergency illumination device, such as an emergency exit indicator light incorporating LED (light-emitting diode), a wall-mounted LED emergency illumination, a wall-embedded LED emergency illumination, etc., is usually set up outdoors. Generally, when a power grid normally supplies power, the emergency exit indicator light incorporating LED keeps illuminating and an energy storage device therein is charged. When the power grid is interrupted, the emergency exit indicator light keeps illuminating until the energy storage device runs out of power supply. A wall-mounted LED emergency illumination and a wall-embedded LED emergency illumination are usually operated in a switch-off state, and they are switched on only when the power grid is interrupted.

Traditional emergency illumination system has a power grid detecting circuit. When the power grid normally supplies power, a charging device converts alternating current (AC) power to direct current (DC) power and charges the energy storage device in the emergency illumination device in a charging mode of constant current (CC) or constant voltage (CV) to maintain the power of the energy storage device. The energy storage device is electrically connected to a detecting circuit which is configured for detecting the state of the energy storage device, to avoid overcharging that causes damages to the energy storage device.

When the power grid is interrupted, a driving device in the illumination system cannot drive the light-emitting device to emit light. At the moment, the power grid detecting circuit outputs a control signal to control a switch element to be switched on such that the energy storage device can supply power to the light-emitting device and make the light-emitting device emit light.

From the above, traditional emergency illumination system can switch on the light-emitting device to emit light when the power grid is interrupted, because it has the power grid detecting circuit, the charging device, the detecting circuit, etc. However, since the traditional emergency illumination systems are all set up outdoors, indoor people still have to turn on flashlights or light up candles and are unable to switch on the emergency illumination system to illuminate when the power grid is interrupted.

Indoor light source is different from outdoor light source. Indoor light source has switches that users can operate the switches to switch on or off. If the indoor light source is combined with the traditional emergency illumination system, a wrong judgment easily happens, such as users switch off the indoor light source while the power grid detecting circuit in the emergency illumination system misjudges that the power grid is interrupted such that the energy storage device supplies power for the light-emitting device.

Therefore, it is desirable to set up the emergency illumination system indoors such that it can perform functions of illumination and be used to avoid that the emergency illumination system has false action when the power grid is interrupted.

SUMMARY

An illumination system and illumination driving method are provided in the present disclosure. An indoor light source is combined with an emergency illumination device in the illumination system, and when an external power source is interrupted, the illumination system can indoors provide illumination.

An embodiment of the present disclosure relates to an illumination system, which includes a light-emitting device, a first switch element, a driving device, a detecting circuit, an arithmetic unit and a power supply unit. The first switch element is electrically connected to an external power source and configured for receiving an external voltage supplied by the external power source; the driving device is electrically connected between the light-emitting device and the first switch element and configured for converting the external voltage to a direct-current power signal for driving the light-emitting device to emit light when the first switch element is switched on; the detecting circuit is connected across both ends of the first switch element and configured for detecting a voltage across the first switch element and converting the voltage to a detecting signal; the arithmetic unit is electrically connected to the driving device and the detecting circuit and configured for performing an arithmetic operation on the direct-current power signal and the detecting signal to generate a control signal; the power supply unit is electrically connected to the arithmetic unit and configured for supplying power for the light-emitting device according to the control signal and configured for driving the light-emitting device to emit light when the external power source is interrupted.

Another embodiment of the present disclosure relates to an illumination system, in which the power supply unit further includes an energy storage device and a second switch element. The second switch element is electrically connected to the energy storage device, the light-emitting device and the arithmetic unit, in which the arithmetic unit is configured for outputting a control signal to the second switch element to control the second switch element.

A further embodiment of the present disclosure relates to an illumination system, in which when the external power source is interrupted, the second switch element receives the control signal to be switched on such that the energy storage device supplies power for the light-emitting device.

Still a further embodiment of the present disclosure relates to an illumination system, which further includes a thermoelectric device. The thermoelectric device is electrically connected between the light-emitting device and the energy storage device and configured for converting thermal energy of the light-emitting device to electrical energy for charging the energy storage device.

Yet a further embodiment of the present disclosure relates to an illumination system, in which the thermoelectric device is configured for charging the energy storage device in a constant voltage mode.

A further embodiment of the present disclosure relates to an illumination system, in which the external power source is an alternating-current power.

Still a further embodiment of the present disclosure relates to an illumination system, in which the light-emitting device is a flat panel light device.

Yet a further embodiment of the present disclosure relates to an illumination system, in which the flat panel light device includes at least one light-emitting diode, a light guide plate and a diffusion plate.

An embodiment of the present disclosure relates to an illumination driving method, which includes following steps: providing a light-emitting device; providing a first switch element electrically connected to an external power source, the first switch element configured for receiving an external voltage supplied by the external power source; providing a driving device electrically connected between the light-emitting device and the first switch element, the driving device configured for converting the external voltage to a direct-current power signal for driving the light-emitting device to emit light when the first switch element is switched on; providing a detecting circuit connected across both ends of the first switch element, the detecting circuit configured for detecting a voltage across the first switch element and converting the voltage to a detecting signal; providing an arithmetic unit electrically connected to the driving device and the detecting circuit, the arithmetic unit configured for performing an arithmetic operation on the direct-current power signal and the detecting signal to generate a control signal; and providing a power supply unit electrically connected to the arithmetic unit, the power supply unit configured for supplying power for the light-emitting device according to the control signal and configured for driving the light-emitting device to emit light when the external power source is interrupted.

Another embodiment of the present disclosure relates to an illumination driving method, in which the power supply unit further includes an energy storage device and a second switch element. The second switch element is electrically connected to the energy storage device, the light-emitting device and the arithmetic unit, in which the arithmetic unit is configured for outputting a control signal to the second switch element to control the second switch element.

A further embodiment of the present disclosure relates to an illumination driving method, in which when the external power source is interrupted, the second switch element receives the control signal to be switched on such that the energy storage device supplies power for the light-emitting device.

Still a further embodiment of the present disclosure relates to an illumination driving method, in which the aforementioned illumination driving method further includes providing a thermoelectric device electrically connected between the light-emitting device and the energy storage device and configured for converting the thermal energy of the light-emitting device to the electrical energy for charging the energy storage device.

Yet a further embodiment of the present disclosure relates to an illumination driving method, in which the thermoelectric device is configured for charging the energy storage device in a constant voltage mode.

A further embodiment of the present disclosure relates to an illumination driving method, in which the external power source is an alternating-current power.

Still a further embodiment of the present disclosure relates to an illumination driving method, in which the light-emitting device is a flat panel light device.

Yet a further embodiment of the present disclosure relates to an illumination driving method, in which the flat panel light device includes at least one light-emitting diode, a light guide plate and a diffusion plate.

It is to be understood that both the aforementioned general description and the following detailed description are by examples, and are intended to provide further explanation of the disclosure as claimed.

BRIEF DESCRIPTION OF THE DRAWINGS

The disclosure can be more fully understood by reading the following detailed description of the embodiment, with reference made to the accompanying drawings as follows.

DETAILED DESCRIPTION

In the following description, specific details are presented to provide a thorough understanding of the embodiments of the present disclosure. Persons of ordinary skill in the art will recognize, however, that the present disclosure can be practiced without one or more of the specific details, or in combination with other components. Well-known implementations or operations are not shown or described in detail to avoid obscuring aspects of various embodiments of the present disclosure.

The terms used in this specification generally have their ordinary meanings in the art and in the specific context where each term is used. The use of examples anywhere in this specification, including examples of any terms discussed herein, is illustrative only, and in no way limits the scope and meaning of the disclosure or of any exemplified term. Likewise, the present disclosure is not limited to various embodiments given in this specification.

Reference throughout the specification to "one embodiment" or "an embodiment" means that a particular feature, structure, implementation, or characteristic described in connection with the embodiment is included in at least one embodiment of the present disclosure. Thus, uses of the phrases "in one embodiment" or "in an embodiment" in various places throughout the specification are not necessarily all referring to the same embodiment. Furthermore, the particular features, structures, implementation, or characteristics may be combined in any suitable manner in one or more embodiments.

In the following description and claims, the terms "coupled" and "connected", along with their derivatives, may be used. In particular embodiments, "connected" and "coupled" may be used to indicate that two or more elements are in direct physical or electrical contact with each other, or may also mean that two or more elements may be in indirect contact with each other. "Coupled" and "connected" may still be used to indicate that two or more elements cooperate or interact with each other.

Figure 1A:
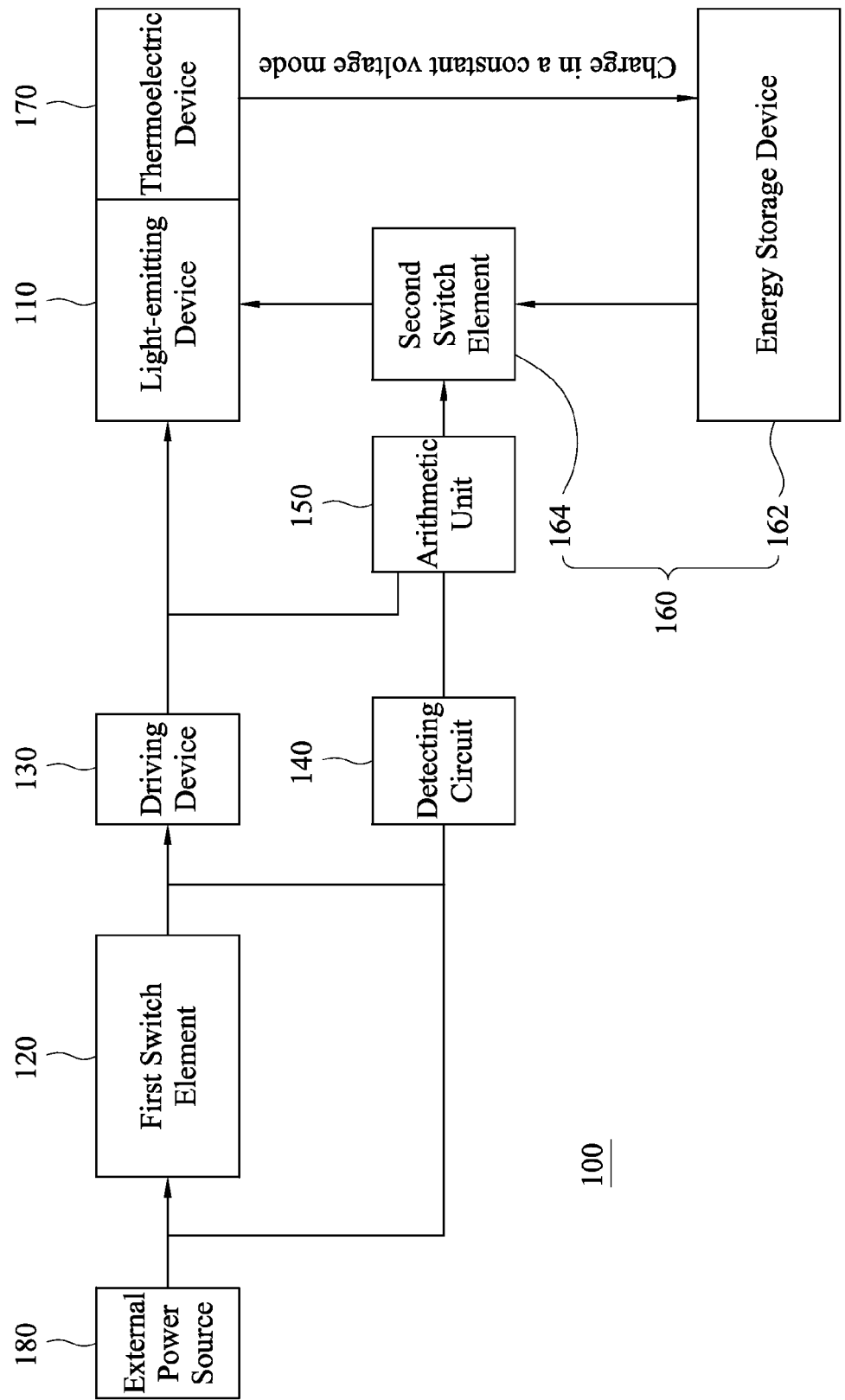
FIG. 1A shows an illumination system according to one embodiment of the present disclosure.

FIG. 1A shows an illumination system according to one embodiment of the present disclosure. An illumination system 100 includes a light-emitting device 110, a first switch element 120, a driving device 130, a detecting circuit 140, an arithmetic unit 150 and a power supply unit 160.

Figure 1B:
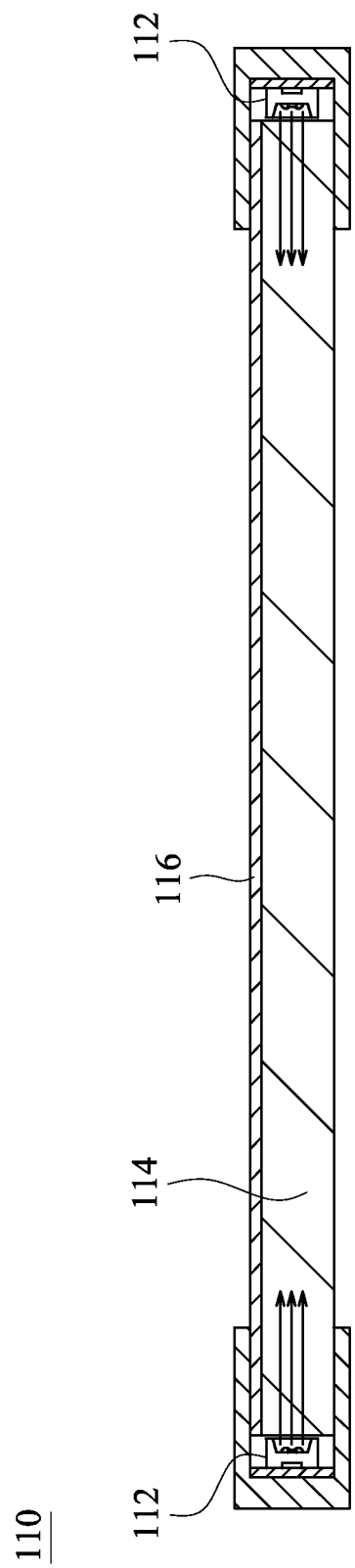
FIG. 1B shows a cross-sectional view of a flat panel light device in an illumination system according to one embodiment of the present disclosure.

FIG. 1B shows a cross-sectional view of a flat panel light device in an illumination system according to one embodiment of the present disclosure. Here, it should be noted that, the light-emitting device 110 can be a flat panel light device including at least one light-emitting diode 112, a light guide plate 114 and a diffusion plate 116, however it is not limited thereto; that is, any light-emitting device (e.g., conventional lamps, light bulbs, etc.) which can be applied in the present disclosure falls within the scope of the present disclosure. Moreover, the driving device 130 can be the driver (e.g., AC/DC driver) for converting an alternating-current power to a direct-current power signal. The arithmetic unit 150 can be an exclusive OR (XOR) gate. The energy storage device 162 can be a battery, but it is not limited thereto.

The first switch element 120 is electrically connected to an external power source 180 and configured for receiving an external voltage supplied by the external power source 180. In practice, the external power source 180 can be an alternating-current power. The driving device 130 is electrically connected between the light-emitting device 110 and the first switch element 120 and configured for converting the aforementioned external voltage to a direct-current power signal for driving the light-emitting device 110 to emit light when the first switch element 120 is switched on. The detecting circuit 140 is connected across both ends of the first switch element 120 and configured for detecting a voltage across the first switch element 120 and converting the voltage to a detecting signal. The arithmetic unit 150 is electrically connected to the driving device 130 and the detecting circuit 140 and configured for performing an arithmetic operation on the direct-current power signal and the detecting signal to generate a control signal. The power supply unit 160 is electrically connected to the arithmetic unit 150 and configured for supplying power for the light-emitting device 110 according to the aforementioned control signal and configured for driving the light-emitting device 110 to emit light when the external power source 180 is interrupted.

In an embodiment, the aforementioned power supply unit 160 further includes an energy storage device 162 and a second switch element 164, in which the second switch element 164 is electrically connected to the energy storage device 162, the light-emitting device 110 and the arithmetic unit 150. Moreover, the second switch element 164 also receives the control signal outputted from the arithmetic unit 150 and is controlled by the control signal.

In operation, when the external power source 180 normally supplies power and the first switch element 120 is switched on (for example, a power grid normally supplies power and an user switches on an indoor light source), the driving device 130 converts the external voltage supplied by the external power source 180 to the direct-current power signal (the voltage level thereof can be a logic high level), and the voltage across both ends of the first switch element 120 which is switched on is zero, and thus the voltage across the first switch element 120, which is detected by the detecting circuit 140, is zero. Then, the detecting circuit 140 converts the voltage to the detecting signal (the signal can be at a logic low level). At the moment, the arithmetic unit 150 performs an arithmetic operation on the direct-current power signal which is at the logic high level and the detecting signal which is at the logic low level, and correspondingly generates a control signal (the control signal can be at the logic low level) to control the second switch element 164 according to the operation result.

Then, the second switch element 164 is switched off through the control signal which has the logic low level such that the energy storage device 162 is unable to supply power for the light-emitting device 110 through the second switch element 164. Since the external power source 180 is in a state of normally supplying power, it is only required that the first switch element 120 is switched on such that the light-emitting device 110 is driven by the driving device 130 to emit light, and there is no need of the energy storage device 162 supplying power for the light-emitting device 110.

Next, when the external power source 180 normally supplies power and the first switch element 120 is switched off (for example, the power grid normally supplies power and the user switches off the indoor light source), the driving device 130 converts the external voltage supplied by the external power source 180 to the direct-current power signal (the voltage level thereof can be a logic low level). The detecting circuit 140 converts the voltage to the detecting signal after detects the voltage across the first switch element 120 (for example, the detected voltage is the external voltage, lower the external voltage to the detecting signal which is 1V, the detecting signal can be at a logic high level). At the moment, the arithmetic unit 150 performs an arithmetic operation on the direct-current power signal which is at the logic high level and the detecting signal, and correspondingly generates the control signal (the control signal can be at the logic low level) to control the second switch element 164 according to the operation result.

Then, the second switch element 164 is switched off through the control signal which has the logic low level such that the energy storage device 162 is unable to supply power for the light-emitting device 110 through the second switch element 164. Since the external power source 180 is in a state of normally supplying power, it is only required that the first switch element 120 is switched on such that the light-emitting device 110 is driven by the driving device 130 to emit light, and there is no need of the energy storage device 162 supplying power for the light-emitting device 110.

Furthermore, when the external power source 180 is interrupted and the first switch element 120 is switched on (for example, the power grid is interrupted and an user switches on the indoor light source), the external voltage received by the driving device 130 is zero, and the driving device 130 converts the external voltage to the direct-current power signal (the voltage level of the direct-current power signal can be the logic low level), and the voltage across the first switch element 120, which is detected by the detecting circuit 140, is zero. Then, the detecting circuit 140 converts the voltage to the detecting signal (the detecting signal can be at the logic low level). At the moment, the arithmetic unit 150 performs an arithmetic operation on the direct-current power signal which is at the logic low level and the detecting signal, and correspondingly generates the control signal (the control signal can be at the logic high level) to control the second switch element 164 according to the operation result.

Since the external power source 180 is in the interrupted state, the light-emitting device 110 is unable to be driven by the driving device 130 and to emit light. Therefore, the aforementioned second switch element 164 is switched on through the control signal which has the logic high level such that the energy storage device 162 supplies power for the light-emitting device 110 through the second switch element 164 to make the light-emitting device 110 emit light.

Moreover, when the external power source 180 is interrupted and the first switch element 120 is switched off (for example, the power grid is interrupted and the user switches off the indoor light source), the external voltage received by the driving device 130 is zero, and the driving device 130 converts the external voltage to the direct-current power signal (the voltage level of the direct-current power signal can be the logic low level), and the voltage across the first switch element 120, which is detected by the detecting circuit 140, is zero. Then, the detecting circuit 140 converts the voltage to the detecting signal (the detecting signal can be at the logic low level). At the moment, the arithmetic unit 150 performs an arithmetic operation on the direct-current power signal which is at the logic low level and the detecting signal, and correspondingly generates the control signal (the control signal can be at the logic high level) to control the second switch element 164 according to the operation result.

Since the external power source 180 is in the interrupted state, the light-emitting device 110 is unable to be driven by the driving device 130 and to emit light. Therefore, the second switch element 164 is switched on through the control signal which has logic high level such that the energy storage device 162 supplies power for the light-emitting device 110 through the second switch element 164 to make the light-emitting device 110 emit light.

In summary, when the external power source is interrupted, no matter the first switch element 120 is switched on or off, the aforementioned direct-current power signal and the detecting signal are both at the logic low level, and the control signal generated after the arithmetic unit 150 performs the arithmetic operation on the direct-current power signal and the detecting signal is at the logic high level. Next, the second switch element 164 is controlled by the control signal having the logic high level to be switched on such that the energy storage device 162 supplies power for the light-emitting device 110 through the second switch element 164 to make the light-emitting device 110 is still able to emit light under the condition that the external power source is interrupted.

On the contrary, when the external power source normally supplies power, no matter the first switch element 120 is switched on or off, the control signal generated after the arithmetic unit 150 performs the arithmetic operation on the direct-current power signal and the detecting signal is at the logic low level. Next, the second switch element 164 is controlled by the control signal to be switched off such that the energy storage device 162 is unable to supply power for the light-emitting device 110 through the second switch element 164. Therefore, when the power grid normally supplies power but the user only switches off the indoor control light source, in the illumination system 100, the energy storage device 162 will not supply power for the light-emitting device 110 to further make the light-emitting device 110 emit light because of the false action.

Figure 2:
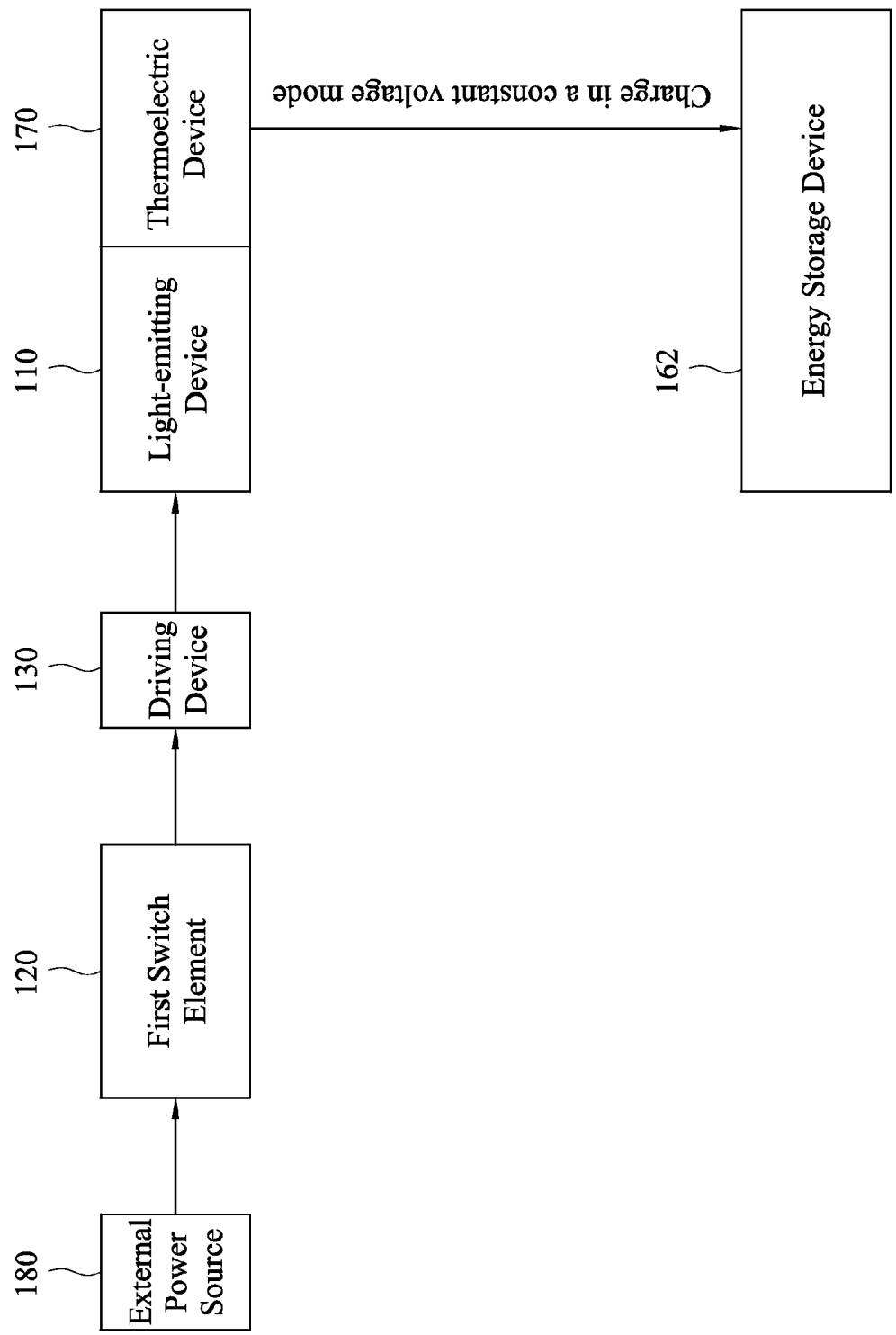
FIG. 2 shows a circuit diagram of an illumination system when an external power source normally supplies power according to one embodiment of the present disclosure.

In addition, the illumination system 100 may further include a thermoelectric device 170. The thermoelectric device 170 is electrically connected between the light-emitting device 110 and the energy storage device 162, and configured for converting thermal energy of the light-emitting device 110 to electrical energy for charging the energy storage device 162. FIG. 2 shows a circuit diagram of an illumination system when the external power source normally supplies power according to one embodiment of the present disclosure. As shown in FIG. 2, when the external power source 180 normally supplies power and the first switch element 120 is switched on, the light-emitting device 110 is driven by the driving device 130 to emit light and generates thermal energy. At the moment, the thermoelectric device 170 is able to convert the thermal energy to the electrical energy and charges the energy storage device 162.

Figure 3:
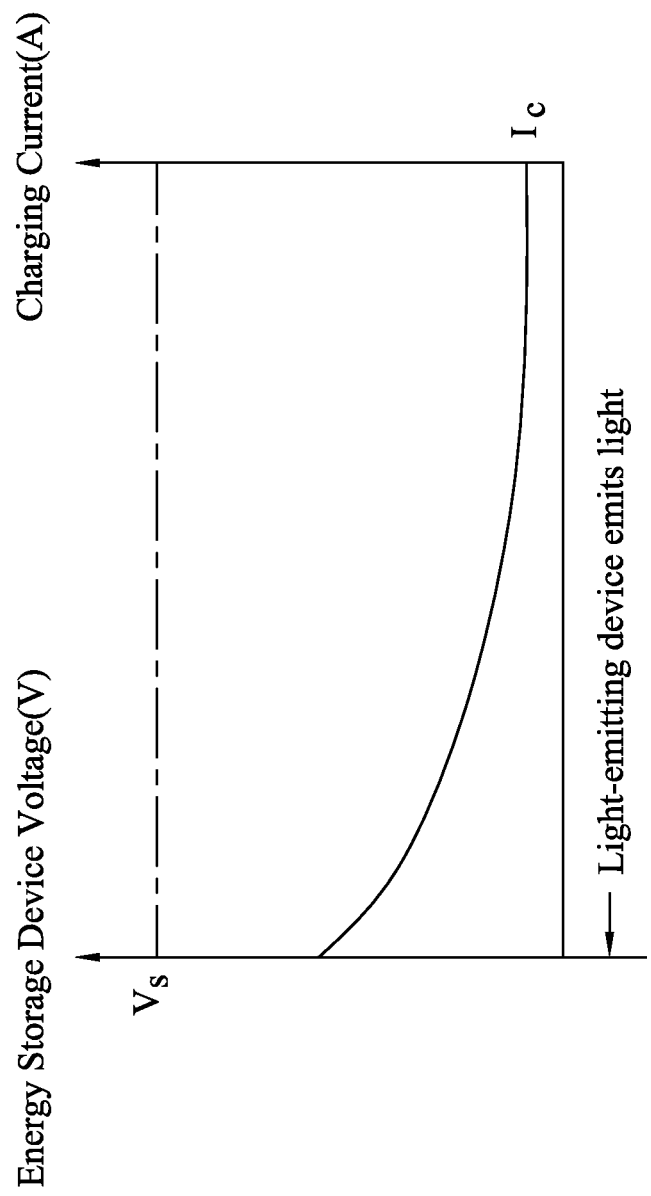
FIG. 3 shows a waveform diagram of an operation that an energy storage device is charged by a thermoelectric device when an external power source normally supplies power according to one embodiment of the present disclosure.

For the purpose of convenience for description, references are made to both of FIG. 2 and FIG. 3. FIG. 3 shows a waveform diagram of an operation that the energy storage device is charged by the thermoelectric device when the external power source normally supplies power according to one embodiment of the disclosure. As shown in FIG. 2, when the external power source 180 normally supplies power and the first switch element 120 is switched on (for example, the power grid normally supplies power and the user switches on the indoor light source), the driving device 130 converts the external voltage supplied by the external power source 180 to a direct-current power signal for driving the light-emitting device 110 to emit light. The thermoelectric device 170 is configured for converting the thermal energy generated when the light-emitting device 110 emits light to the electrical energy for charging the energy storage device 162 in a constant voltage mode.

As shown in FIG. 3, when the light-emitting device 110 starts to emit light, the thermoelectric device 170 starts to charge the energy storage device 162. The voltage Vs of the energy storage device 162 always remains constant to avoid overcharging (e.g., overcharge on a battery) that causes damages to the energy storage device 162. As shown in FIG. 3, at the beginning of charging, since the voltage difference between the thermoelectric device 170 and the energy storage device 162 is larger, the charging current Ic of the energy storage device 162 charged by the thermoelectric device 170 is larger. After being charged for a period of time, the voltage difference between both of them gradually decreases. Therefore, the charging current Ic also gradually decreases and reaches a steady state.

Here, it should be noted that, the output voltage of the thermoelectric device 170 charging the energy storage device 162 is the same as the voltage Vs of the energy storage device 162 (as shown in FIG. 3), in order to perform the charging operation in the constant voltage mode.

Figure 4:
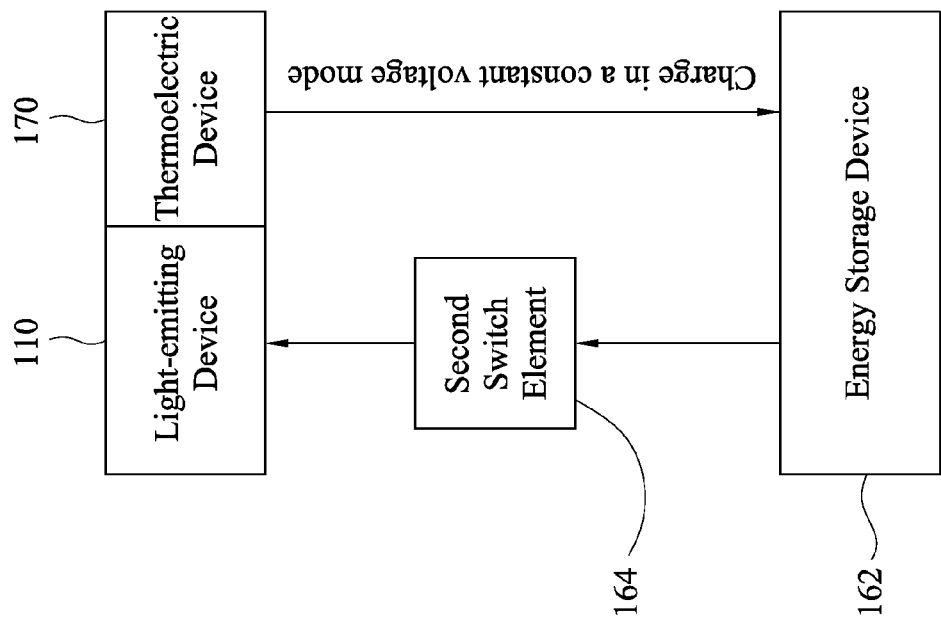
FIG. 4 shows a circuit diagram of an illumination system when an external power source is interrupted according to one embodiment of the present disclosure.
Figure 5:
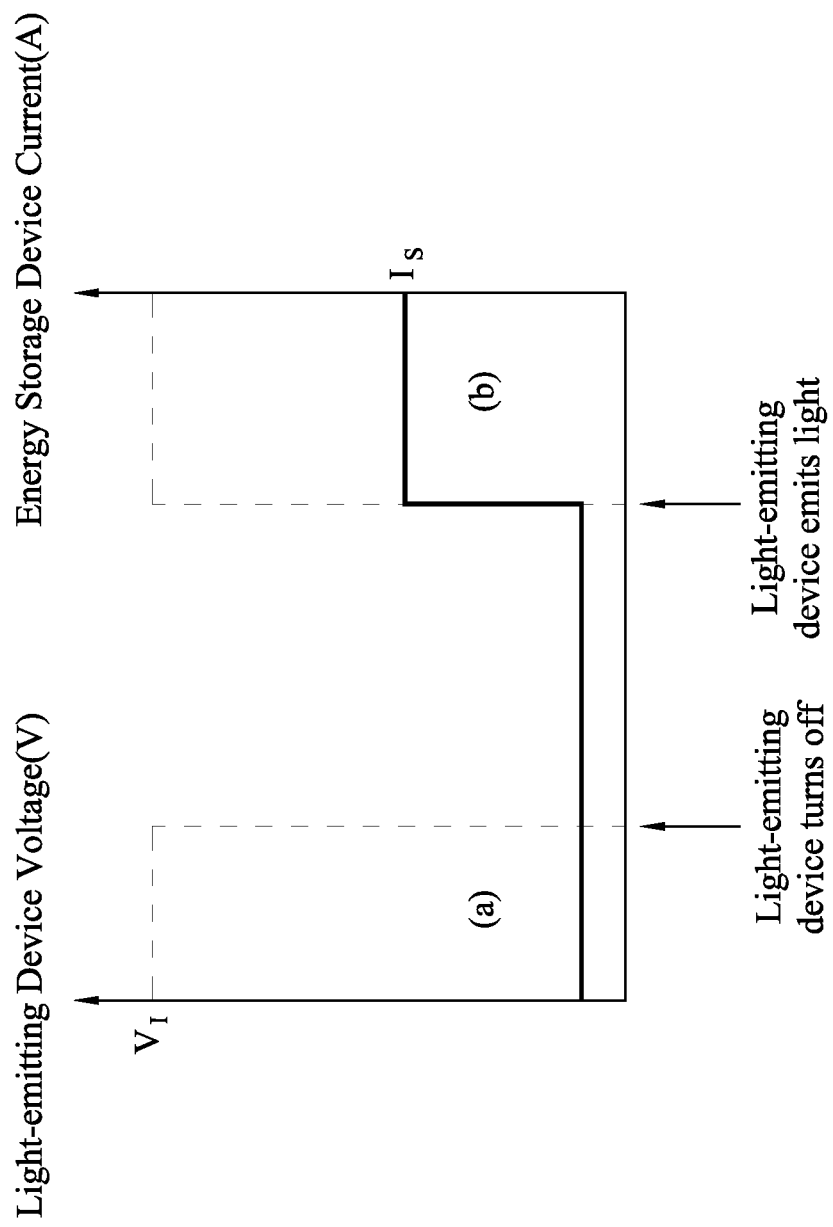
FIG. 5 shows a waveform diagram of an operation that an energy storage device supplies power for a thermoelectric device when an external power source is interrupted according to one embodiment of the present disclosure.

Also for the purpose of convenience for description, references are made to both of FIG. 4 and FIG. 5. FIG. 4 shows a circuit diagram of an illumination system when the external power source is interrupted according to one embodiment of the present disclosure. FIG. 5 shows a waveform diagram of an operation that the energy storage device supplies power for the thermoelectric device when the external power source is interrupted according to one embodiment of the present disclosure. When the external power source 180 is interrupted, the second switch element 164 receives the control signal generated by the arithmetic unit 150 (see FIG. 1) to be switched on such that the energy storage device 162 supplies power for the light-emitting device 110 through the second switch element 164 to make the light-emitting device 110 emit light.

As shown in FIG. 4, the thermoelectric device 170 converts the thermal energy generated by emitting light from the light-emitting device 110 to the electrical energy. At the same time, the thermoelectric device 170 charges the energy storage device 162 in a constant voltage mode to extend the power supplying time of the energy storage device 162.

Next, reference is made to FIG. 5. The light-emitting device 110 emits light respectively in area (a) and area (b). At the moment, the voltage of the light-emitting device 110 is represented as $V_f$ in FIG. 5. As shown in the area (a), when the external power source 180 normally supplies power (see FIG. 1), the light-emitting device 110 emits light. However, the energy storage device 162 fails to supply power for the light-emitting device 110. Therefore, the output current of the energy storage device 162 is zero. Moreover, when the external power source 180 is interrupted, the situation of the light-emitting device 110 powered by the energy storage device 162 to emit light is shown in the area (b). The output current of the energy storage device 162 is represented as $I_S$ in FIG. 5.

Figure 6:
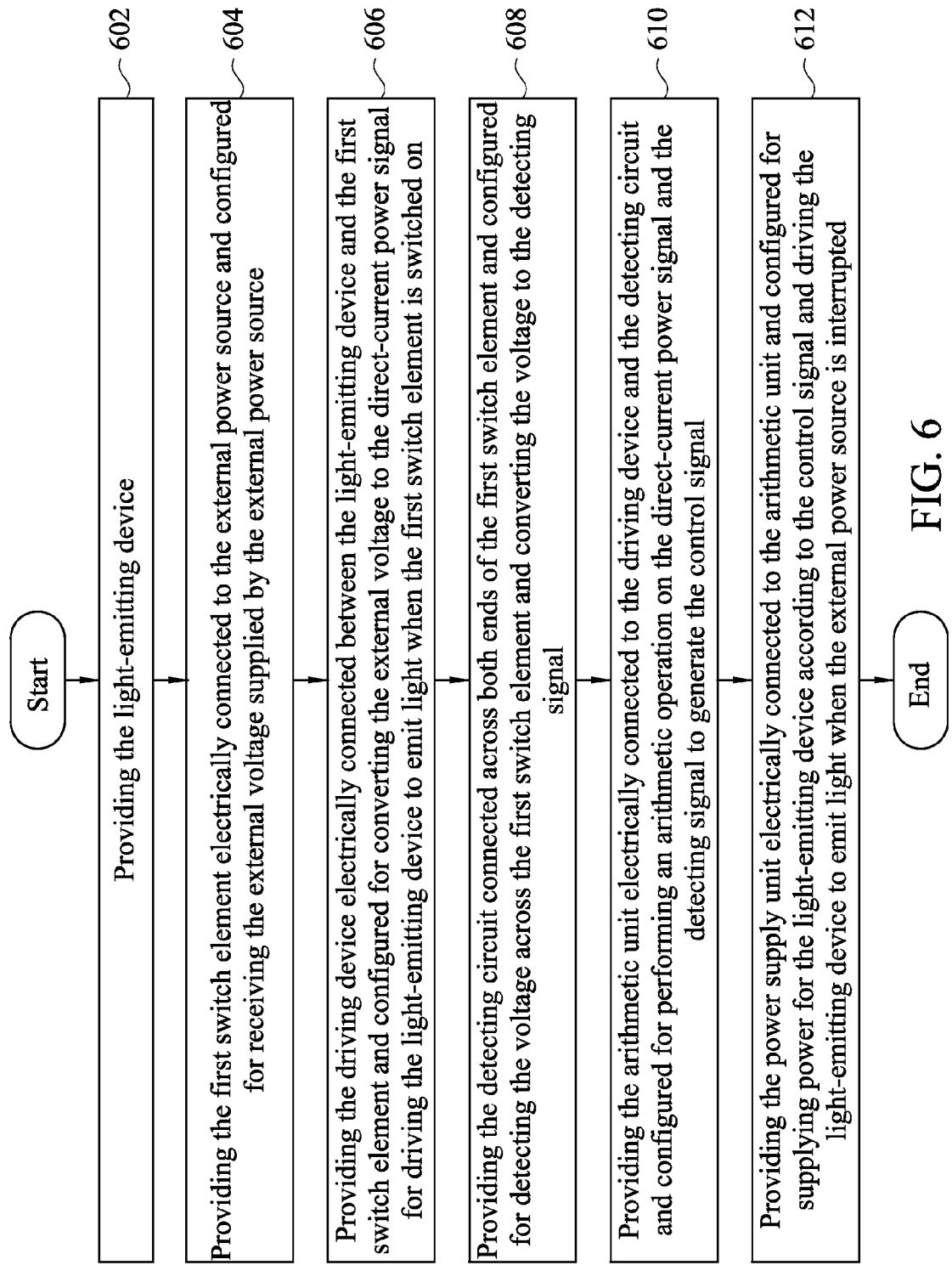
FIG. 6 shows a flow chart of an illumination driving method according to one embodiment of the present disclosure.

Another embodiment of the present disclosure discloses an illumination driving method. As shown in FIG. 6, FIG. 6 shows a flow chart of an illumination driving method according to one embodiment of the present disclosure. For the purpose of convenience for description, references are made to both of FIG. 1 and FIG. 6. First, the light-emitting device 110 is provided (step 602). Next, the first switch element 120 is provided and electrically connected to the external power source 180 for receiving the external voltage supplied by the external power source 180 (step 604). Then, the driving device 130 is provided and electrically connected between the light-emitting device 110 and the first switch element 120 and configured for converting the aforementioned external voltage to the direct-current power signal for driving the light-emitting device 110 to emit light when the first switch element 120 is switched on (step 606).

In step 608, the detecting circuit 140 is provided and connected across both ends of the first switch element 120. The detecting circuit 140 is configured for detecting the voltage across the first switch element 120 and converting the voltage to the detecting signal. Next, in step 610, the arithmetic unit 150 is provided and electrically connected to the driving device 130 and the detecting circuit 140 and configured for performing an arithmetic operation on the direct-current power signal and the detecting signal to generate the control signal. Then, in step 612, the power supply unit 160 is provided and electrically connected to the arithmetic unit 150 and configured for supplying power for the light-emitting device 110 according to the aforementioned control signal and configured for driving the light-emitting device 110 to emit light when the external power source 180 is interrupted.

The aforementioned power supply unit 160 is shown in FIG. 1 and includes the energy storage device 162 and the second switch element 164. The uses and the connections related to other elements are the same as described above. Moreover, in another embodiment, the illumination driving method disclosed in the disclosure further includes the step of providing a thermoelectric device 170. The uses and the connections related to other elements of the thermoelectric device 170 are also the same as described above. It is unnecessary to go into them here.

In summary, nowadays emergency illumination systems and indoor light sources are systems independent with each other. An illumination system and illumination driving method are disclosed in the disclosure which integrates indoor light sources and emergency illumination systems to provide the illumination function indoors when the power grid is interrupted, and to avoid the illumination system misjudging the power grid being interrupted such that the energy storage device supplies power for the light-emitting device to make the light-emitting device emit light because users switch off indoor light source when the power grid normally supplies power.

Moreover, there is no need to build a charging circuit in the present disclosure. The thermoelectric device is used for charging the energy storage device in a constant voltage mode to avoid overcharging that causes damages to the energy storage device.

Although the present disclosure has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present disclosure without departing from the scope or spirit of the disclosure. In view of the forgoing, it is intended that the present disclosure cover modifications and variations of this disclosure provided they fall within the scope of the following claims.

What is claimed is:

1. An illumination system, comprising
    a light-emitting device;
    a first switch element electrically connected to an external power source, the first switch element configured for receiving an external voltage supplied by the external power source;
    a driving device electrically connected between the light-emitting device and the first switch element, the driving device configured for converting the external voltage to a direct-current power signal for driving the light-emitting device to emit light when the first switch element is switched on;
    a detecting circuit connected across both ends of the first switch element, the detecting circuit configured for detecting a voltage across the first switch element and converting the voltage to a detecting signal;
    an arithmetic unit electrically connected to the driving device and the detecting circuit, the arithmetic unit configured for performing an arithmetic operation on the direct-current power signal and the detecting signal to generate a control signal; and
    a power supply unit electrically connected to the arithmetic unit, the power supply unit configured for supplying power for the light-emitting device according to the control signal and configured for driving the light-emitting device to emit light when the external power source is interrupted.

2. The illumination system of claim 1, wherein the power supply unit further comprises:
    an energy storage device; and
    a second switch element electrically connected to the energy storage device, the light-emitting device and the arithmetic unit, wherein the arithmetic unit is configured for outputting a control signal to the second switch element to control the second switch element.

3. The illumination system of claim 2, wherein when the external power source is interrupted, the second switch element receives the control signal to be switched on such that the energy storage device supplies power for the light-emitting device.

4. The illumination system of claim 3, further comprising:
    a thermoelectric device electrically connected between the light-emitting device and the energy storage device, the thermoelectric device configured for converting thermal energy of the light-emitting device to electrical energy for charging the energy storage device.

5. The illumination system of claim 4, wherein the thermoelectric device is configured for charging the energy storage device in a constant voltage mode.

6. The illumination system of either claim 2, further comprising:
    a thermoelectric device electrically connected between the light-emitting device and the energy storage device, the thermoelectric device configured for converting thermal energy of the light-emitting device to electrical energy for charging the energy storage device.

7. The illumination system of claim 6, wherein the thermoelectric device is configured for charging the energy storage device in a constant voltage mode.

8. The illumination system of claim 1, wherein the external power source is an alternating-current power.

9. The illumination system of claim 1, wherein the light-emitting device is a flat panel light device.

10. The illumination system of claim 9, wherein the flat panel light device comprises at least one light-emitting diode, a light guide plate and a diffusion plate.

11. An illumination driving method, comprising:
providing a light-emitting device;
providing a first switch element electrically connected to an external power source, the first switch element configured for receiving an external voltage supplied by the external power source;
providing a driving device electrically connected between the light-emitting device and the first switch element, the driving device configured for converting the external voltage to a direct-current power signal for driving the light-emitting device to emit light when the first switch element is switched on;
providing a detecting circuit connected across both ends of the first switch element, the detecting circuit configured for detecting a voltage across the first switch element and converting the voltage to a detecting signal;
providing an arithmetic unit electrically connected to the driving device and the detecting circuit, the arithmetic unit configured for performing an arithmetic operation on the direct-current power signal and the detecting signal to generate a control signal; and
providing a power supply unit electrically connected to the arithmetic unit, the power supply unit configured for supplying power for the light-emitting device according to the control signal and configured for driving the light-emitting device to emit light when the external power source is interrupted.

12. The illumination driving method of claim 11, wherein the power supply unit further comprises:
an energy storage device; and
a second switch element electrically connected to the energy storage device, the light-emitting device and the arithmetic unit, wherein the arithmetic unit is configured for outputting a control signal to the second switch element to control the second switch element.

13. The illumination driving method of claim 12, wherein when the external power source is interrupted, the second switch element receives the control signal to be switched on such that the energy storage device supplies power for the light-emitting device.

14. The illumination driving method of claim 13, further comprising providing a thermoelectric device electrically connected between the light-emitting device and the energy storage device, the thermoelectric device configured for converting thermal energy of the light-emitting device to electrical energy for charging the energy storage device.

15. The illumination driving method of claim 14, wherein the thermoelectric device is configured for charging the energy storage device in a constant voltage mode.

16. The illumination driving method of claim 12, further comprising providing a thermoelectric device electrically connected between the light-emitting device and the energy storage device, the thermoelectric device configured for converting thermal energy of the light-emitting device to electrical energy for charging the energy storage device.

17. The illumination driving method of claim 16, wherein the thermoelectric device is configured for charging the energy storage device in a constant voltage mode.

18. The illumination driving method of claim 11, wherein the external power source is an alternating-current power.

19. The illumination driving method of claim 11, wherein the light-emitting device is a flat panel light device.

20. The illumination driving method of claim 19, wherein the flat panel light device comprises at least one light-emitting diode, a light guide plate and a diffusion plate.

* * * * *